United States Patent
Doris et al.

(10) Patent No.: US 6,946,358 B2
(45) Date of Patent: Sep. 20, 2005

(54) METHOD OF FABRICATING SHALLOW TRENCH ISOLATION BY ULTRA-THIN SIMOX PROCESSING

(75) Inventors: Bruce B. Doris, Brewster, NY (US); Mark C. Hakey, Fairfax, VT (US); Akihisa Sekiguchi, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/250,053

(22) Filed: May 30, 2003

(65) Prior Publication Data

US 2004/0241955 A1 Dec. 2, 2004

(51) Int. Cl.[7] .......................... H01L 21/76; H01L 21/20; H01L 21/36; H01L 21/31
(52) U.S. Cl. ....................... 438/424; 438/423; 438/766; 438/484
(58) Field of Search ................. 438/424, 423, 438/766

(56) References Cited

U.S. PATENT DOCUMENTS

| | | | |
|---|---|---|---|
| 5,665,613 A | | 9/1997 | Nakashima et al. |
| 6,214,657 B1 * | | 4/2001 | Lee ............................. 438/219 |
| 6,261,876 B1 * | | 7/2001 | Crowder et al. ............ 438/149 |
| 6,281,593 B1 | | 8/2001 | Brown et al. |
| 6,333,234 B1 | | 12/2001 | Liu |
| 6,344,374 B1 * | | 2/2002 | Tseng ......................... 438/131 |
| 6,350,703 B1 * | | 2/2002 | Sakaguchi et al. .......... 438/766 |
| 6,563,172 B2 * | | 5/2003 | Yoshida et al. ............. 257/347 |
| 6,613,639 B1 * | | 9/2003 | Comard ....................... 438/311 |
| 6,693,333 B1 * | | 2/2004 | Yu ............................... 257/407 |
| 6,737,332 B1 * | | 5/2004 | Fuselier et al. ............. 438/423 |
| 2003/0186511 A1 * | | 10/2003 | Yiu et al. .................... 438/400 |

* cited by examiner

*Primary Examiner*—Matthew Smith
*Assistant Examiner*—Chuong Anh Luu
(74) *Attorney, Agent, or Firm*—Scully, Scott, Murphy & Presser; Joseph P. Abate, Esq.

(57) ABSTRACT

The present invention provides a cost effective and simple method of forming isolation regions, such as shallow trench isolation regions, in a semiconductor substrate that avoids etching into the trench. In the present invention, the isolation regions are formed by utilizing a selective ion implantation process that creates an oxygen implant region near the upper surface of the substrate. Upon a subsequent anneal step, the oxygen implant region is converted into an isolation region that has an upper surface that is substantially coplanar with the upper surface of the substrate.

10 Claims, 6 Drawing Sheets

METHOD OF FABRICATING SHALLOW TRENCH ISOLATION BY ULTRA-THIN SIMOX PROCESSING

BACKGROUND OF INVENTION

The present invention generally relates to semiconductor processing, and more particularly to a method of fabricating isolation regions, such as shallow trench isolation (STI), using an ultra-thin separation by ion implantation of oxygen (SIMOX) process.

One of the first widely practiced isolation schemes for isolating devices was called local oxidation of silicon (LOCOS). In the LOCOS process, a pad oxide and a pad nitride are patterned on a Si surface. The exposed regions of Si are oxidized while the patterned regions are prevented from oxidation. The problem with the LOCOS process is that lateral oxidation occurs causing a "bird's beak" which limits the usable active area size.

In the semiconductor industry, it is currently well known to isolate one or more device regions present on a semiconductor structure using isolation regions such as shallow trench isolation (STI) regions. State-of-the-art STI processing includes many steps that are time consuming and which add extra cost to the overall fabrication of a semiconductor device.

A standard STI process is shown, for example, in FIGS. 1A–1C. Specifically, prior art FIG. 1A illustrates an initial processing step in which a pad stack comprising an oxide 12 and a nitride 14 is formed atop a surface of a semiconductor substrate 10. An optional hard mask (not shown) may also be formed atop the nitride layer 14 of the pad stack.

Next, lithography is employed in providing a trench pattern to the structure. Specifically, the trench pattern is formed by first applying a photoresist on the upper surface of the pad stack. The photoresist is then exposed to a pattern of radiation and thereafter the pattern in the photoresist is developed using a resist developer. An etching step is used to transfer the pattern from the photoresist into the nitride layer 14. After the initial pattern transfer, the photoresist is removed utilizing a stripping process and then etching continues through the oxide layer 12 stopping atop an upper surface of semiconductor substrate 10 so as to provide a structure having an opening 16 in the oxide layer 12 as shown, for example, in FIG. 1B.

After providing the structure shown in FIG. 1B, a trench is formed in the semiconductor substrate 10 via etching through the opening 16. A trench liner 20 is typically formed via oxidation on the bare sidewalls of the trench including the sidewalls of the oxide layer 12. The trench is then filled with a trench dielectric material 22 such as $SiO_2$, tetraethylorthosilicate (TEOS) or a high-density plasma oxide and thereafter the structure is planarized to the upper surface of the nitride layer 14. A deglazing process may follow the trench fill step. After deglazing, the nitride layer 14 is removed providing a structure having an STI region 24 formed in the surface of semiconductor substrate 10. The structure including STI region 24, which includes liner 20 and dielectric fill 22, is shown, for example, in FIG. 1C. The oxide layer 12 is then removed by chemical mechanical polishing (CMP).

In addition to being time consuming and costly, STI regions produced from the prior art process mentioned above may contain divots at the STI/substrate corners. The presence of divots at the STI/substrate corner is undesirable since divots create unwanted features such as polysilicon rails and an early "turn-on" characteristic in the device.

In view of the drawbacks mentioned above with the prior art, process of fabricating STI regions, there is a need for providing a simplified method of forming isolation regions such as STIs, which provides equivalent or improved isolation performance, yet at a distinct cost advantage as compared with the prior art process.

SUMMARY OF INVENTION

An object of the present invention is to provide a simplified method of forming isolation regions in a semiconductor substrate that avoids the numerous processing steps used in the prior art to form isolation regions.

A further object of the present invention is to provide a method for forming isolation regions that is not time consuming.

A yet further object of the present invention is to provide a cost effective method of forming isolation regions in a semiconductor substrate.

A still further object of the present invention is to provide a method of forming shallow trench isolation (STI) regions in a semiconductor substrate. The term "shallow" when used in conjunction with the phrase "isolation trench region" denotes a depth, as measured from the upper surface of the substrate to the lower surface of the isolation region, of about 1 $\mu$m or less, with a depth of from about 0.25 $\mu$m to about 0.5 $\mu$m being more highly preferred.

An even further object of the present invention is to provide a method of fabricating an SOI layer and an isolation region in the same process module thereby reducing complexity and raw process time.

A yet even further object of the present invention is to provide a method of fabricating a structure in which no interface exists between a buried oxide region (i.e., the lateral isolation) and an isolation region (i.e., the vertical isolation) and no appreciable bird's beak or lateral oxidation as is commonly present in the LOCOS isolation scheme.

These and other objects and advantages are achieved in the present invention by utilizing an ultra-thin separation by ion implantation of oxygen (SIMOX) process to form trench isolation regions, such as shallow trench isolation (STI), in a semiconductor substrate. Although the term "trench" may be used in describing the isolation regions formed in the present invention, the inventive process does not form a trench into the substrate via an etching process. Instead, the ultra-thin SIMOX process implants oxygen ions at or near the upper surface region of a semiconductor substrate to form an implant region in the substrate that is subsequently converted into an isolation region by an annealing step.

It is noted that SIMOX is a process that is generally employed in the prior art for forming a silicon-on-insulator (SOI) substrate. In the SIMOX process for producing an SOI substrate, oxygen ions are implanted beneath the upper surface of a Si-containing substrate to form an oxygen implant region in the substrate. The substrate including the oxygen implant region is then annealed to form a buried oxide layer that electrically separates a top Si-containing layer (i.e., the SOI layer) from a bottom Si-containing layer.

The SIMOX process used in forming SOI regions does not form a shallow isolation region in the substrate that is present at the upper surface of the substrate. That is, SIMOX was not previously used to form an isolation region that is substantially coplanar with an upper surface of the substrate. Instead, prior art SIMOX processes form a buried oxygen region within the substrate that separates the SOI layer from a bottom semiconductor layer. In the ultra-thin SIMOX process of the present invention, oxygen is implanted at or near the upper surface of the semiconductor substrate so that during a subsequent anneal an isolation region having an upper surface that is substantially coplanar with the upper surface of the substrate is formed.

In broad terms, the present invention provides a method of forming an isolation region in a semiconductor substrate that comprises the steps of:

providing a structure having an oxide layer located on top of an upper surface of a semiconductor substrate;

selectively implanting oxygen ions into an upper surface region of the semiconductor substrate to form an oxygen implant region in the upper surface region; and annealing the oxygen implant region to convert the oxygen implant region into an isolation region having an upper surface that is substantially coplanar with the upper surface of the semiconductor substrate.

The method of the present invention may be used to form shallow trench isolation or deep trench isolation depending upon the conditions of the selective implant step. In a highly preferred embodiment, the method of the present invention is used to form shallow trench isolation regions.

In one embodiment of the present invention, the selective implant step includes the use of a patterned photoresist that has a sufficient thickness so as to prevent oxygen ions from being implanted into the substrate. In this embodiment, the oxygen ions are only implanted though an opening in the patterned photbresist.

In another embodiment of the present invention, the selective implant includes the use of a patterned implant mask that has a thickness that is thin enough to allow oxygen ions to be implanted into the substrate. In this embodiment, the oxygen ions are implanted across the entire wafer forming an SOI layer and an isolation region. The isolation regions are formed in the region of. the substrate in which the patterned implant mask is present. This embodiment of the present invention forms a structure with no interface between the lateral isolation (buried oxide layer) and the vertical isolation (isolation region) regions

DETAILED DESCRIPTION

Figure 1A:
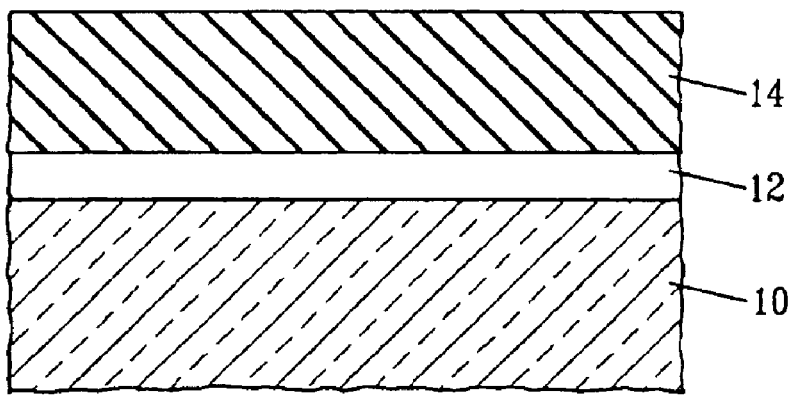
FIGS. 1A–1C are pictorial representations (through cross sectional views) illustrating the prior art method of fabricating shallow trench isolation regions in a semiconductor substrate.
Figure 1B:
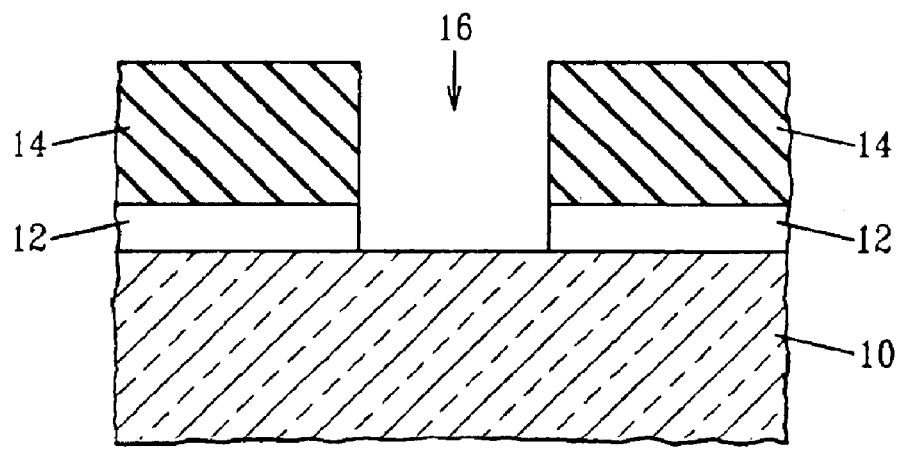
Figure 1C:
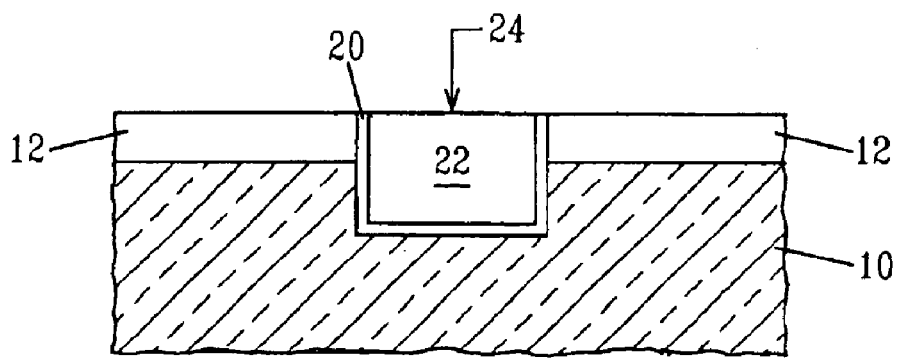

The present invention, which provides a simplified method of fabricating isolation regions, such as shallow trench isolation, in a semiconductor substrate using an ultra-thin SIMOX process, will now be described in greater detail by referring to the drawings that accompany the present application. FIGS. 2A–2E, FIGS. 3A–3E and FIGS. 4A–4C represent embodiments of the method of the present invention. It is noted that in these drawings of the present invention, like and corresponding elements are referred to by like reference numerals. It is also noted that although the drawings and description that follow recite the formation of a single isolation region, the method of the present invention, together with the various embodiments thereof, can be used in forming a plurality of isolation regions in the substrate.

Reference is first made to the embodiment depicted in FIGS. 2A–2E. In this embodiment of the present invention, a patterned photoresist having a sufficient thickness to prevent oxygen ions from being implanted into the substrate is employed. Thus, oxygen ions are only implanted into the substrate in regions wherein openings are present in the patterned photoresist mask.

Figure 2A:
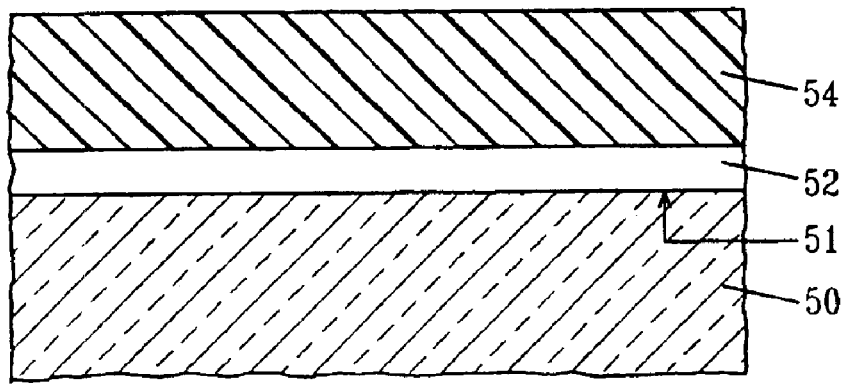
FIGS. 2A–2E are pictorial representations (through cross sectional views) illustrating a first method of the present invention.
Figure 2B:
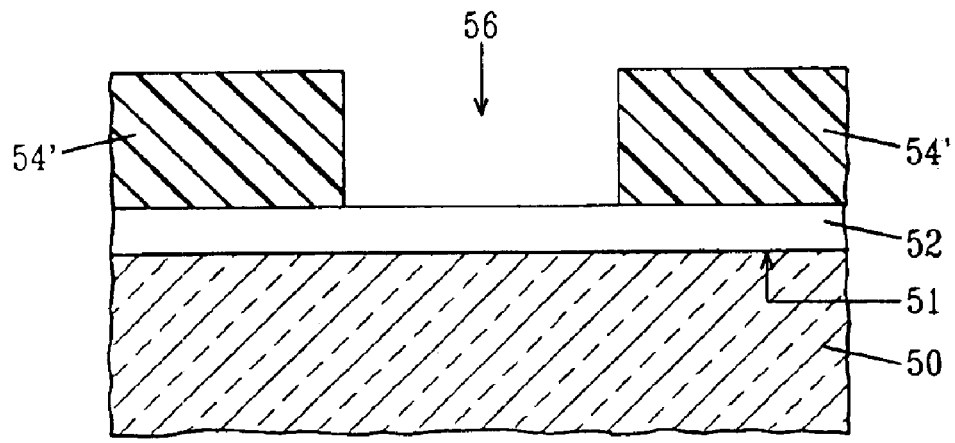

Specifically, FIG. 2A shows an initial structure of the first embodiment of the present application. In FIG. 2A, there is shown a semiconductor substrate 50 having an oxide layer 52 and a photoresist 54 formed thereon. As shown, the oxide layer 52 is located on an upper surface (designated by reference numeral 51) of the semiconductor substrate 50, while the photoresist 54 is applied on top of the oxide layer 52.

The semiconductor substrate employed in the present invention is a Si-containing material including, but not limited to: Si, SiGe, SiGeC, SiC, a silicon-on-insulator (SOI) and combinations thereof, e.g., a stack of Si/SiGe or Si/SOI. The SOI substrate includes a buried oxide layer that electrically isolates a top Si-containing layer, i.e., the SOI layer, from a bottom Si-containing layer.

When an SOI substrate is employed in the present invention, the top Si-containing layer of the SOI substrate may have a vertical thickness, $t_V$, i.e., height, of less than about 300 nm, with a vertical thickness of from about 50 nm to about 100 nm being more highly preferred. The thickness of the buried oxide may vary, but typically, the buried insulating layer has a thickness of less than about 350 nm, with a thickness of from about 1 nm to about 100 nm being more highly preferred. The thickness of the bottom Si-containing layer of the SOI substrate is inconsequential to the present invention.

The SOI substrate is fabricated using techniques that are well known to those skilled in the art. For example, the SOI substrate may be fabricated using a thermal bonding process, or alternatively the SOI substrate may be fabricated by an ion implantation process that is referred to in the art as separation by ion implantation of oxygen (SIMOX). When a thermal bonding process is employed in fabricating the SOI substrate, an optional thinning step may be utilized to thin the top Si-containing layer into an ultra-thin regime which is on the order of less than 50 nm.

The oxide layer 52 is formed on the upper surface 51 of the semiconductor substrate 50 using either a thermal oxidation process or a deposition process such as chemical vapor deposition (CVD) or plasma-assisted CVD. The thickness of the oxide layer 52 may vary depending upon the technique used in forming the same. Typically, however, the oxide layer 52 has a thickness of from about 1 nm to about 200 nm.

After the oxide layer 52 has been formed on the semiconductor substrate 50, the photoresist 54 is formed atop the oxide layer 52 using a conventional deposition process such as CVD, spin-on coating, or sputtering. In this embodiment, the photoresist 54 has a thickness of from about 10 nm to about 1000 nm, with a thickness of from about 400 nm to about 800 nm being more highly preferred. At these thickness values, the photoresist is sufficiently thick enough to prevent oxygen ions from being implanted into the semiconductor substrate 50.

Photoresist 54 is then subjected to a lithographic process which provides a patterned photoresist 54' that has at least one opening 56 that exposes the surface of oxide layer 52. The resultant structure that is formed after lithography is shown, for example, in FIG. 2B. Specifically, the patterned photoresist 54' is formed by first exposing the photoresist 54 to a pattern of radiation and thereafter the pattern is developed into the exposed photoresist using a conventional resist developer. The pattern used in this embodiment of the present invention is one in which the active device areas of the semiconductor substrate 50 are protected by the patterned photoresist 54' while the regions that will comprise the isolation are exposed.

Figure 2C:
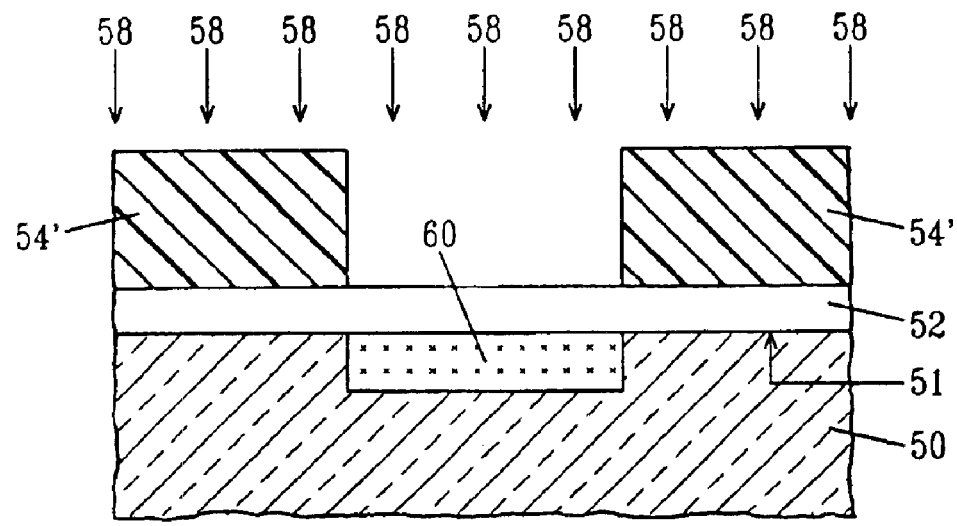
Figure 2D:
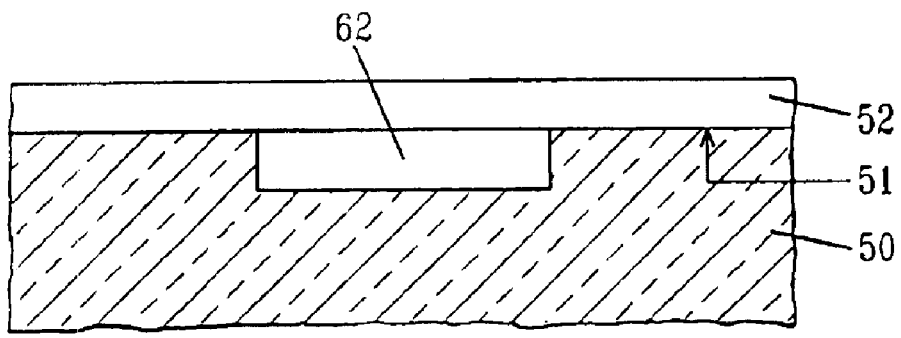

Next, and as shown in FIG. 2C, a first oxygen ion implantation process used to create an oxygen profile in the substrate is performed. Specifically, the structure including the patterned photoresist 54' is subjected to an oxygen ion implant step wherein oxygen ions 58 are implanted through the at least one opening 56 providing an oxygen implant region 60 in an upper surface region of the semiconductor substrate 50. The oxygen implant region 60 is an area created in the substrate that has a concentration of oxygen ions that is sufficient for forming $SiO_2$ when subjected to a subsequent anneal. The upper portion of the oxygen implant region may be formed at or slightly below the interface formed between the oxide layer 52 and the upper surface 51 of the semiconductor substrate 50. Because of the thickness of the photoresist, no oxygen implant regions are formed beneath the protected portions of the structure.

The oxygen implantation step used at this point of the present invention may comprise a conventional ion implantation process or any other technique of implanting oxygen ions may be used, for example, plasma emersion. Although the present application contemplates other techniques of implanting oxygen ions into the substrate, it is preferred in the present invention to use an ion implantation step.

The conditions of the oxygen ion implantation step used to create oxygen implant region 60 may vary. Typically, the oxygen implant region 60 is created using the following implantation conditions: The energy used to implant the oxygen may be in the range of from about 2 keV to about 500 keV with a current of about 100 mA. The dose of oxygen ray be in the range from about $6 \times 10^{15}$ atoms/cm$^2$ to about $5 \times 10^{18}$ atoms/cm$^2$. It is noted that these implantation conditions are exemplary and that the present invention contemplates other implant conditions, i.e., energy, current, and dose, which are capable of forming an oxygen implant region in the upper surface region (i.e., at or near the substrate/oxide interface) of semiconductor substrate 50.

After forming the oxygen implant region 60 into the upper surface region of semiconductor substrate, patterned photoresist 54' is selectively removed from the structure utilizing a conventional stripping process that is capable of selectively removing a photoresist from an oxide layer. The structure is then annealed under conditions that are capable of converting the oxygen implant region 60 into an isolation region 62. The resultant structure formed after photoresist removal and annealing is shown, for example, in FIG 2D. The isolation region 62 formed in the present invention is an isolation oxide that may be characterized as a shallow trench isolation region or a deep trench isolation region depending upon the depth of the implant.

The annealing step of the present invention is carried out using a conventional furnace annealing process. In some embodiments, not shown, it may be advantageous to cap the structure with a SiN film prior to annealing. When such an embodiment is employed, the patterned photoresist 54' is first removed and then the SiN film is formed directly on top of the oxide layer 52. The SiN film typically has a thickness of from about 20 nm to about 200 nm.

Although the present invention contemplates various furnace anneal conditions, it is preferred to perform the anneal at a temperature of from about 900° C. to about 1500° C. for a time period of from about 1 hour to about 30 hours. The annealing environment employed in the present invention is an oxygen-containing ambient that may or may not be admixed with an inert gas such as He, Ar, Ne, Xe, Kr and/or $N_2$. Illustrative examples of oxygen-containing ambients include, but are not limited to: $O_2$, ozone, air, steam, NO and mixtures thereof. The concentration of oxygen present during the anneal mayvary from about 0.1% to about 100%. A preferred annealing atmosphere is $O_2$ that is admixed with $N_2$.

The depth of the isolation region 62 formed at this point of the present invention is determined by the energy and dose of the oxygen implantation process. As stated above, it is possible to form deep trench isolation regions or shallow trench isolation regions, with shallow trench isolation regions being highly preferred. Typically, the depth of the shallow trench isolation region that is formed in the present invention is about 1 μm or less, with a depth of from about 0.25 μm to about 0.5 μm being more highly preferred. The desired oxygen profile may be obtained by simultaneously optimizing the ion implantation energy, dose as well as the oxide layer 52 thickness. In some cases, several energies with various implant doses may be used to create the desired oxygen implant profile and subsequent isolation depth.

Figure 2E:
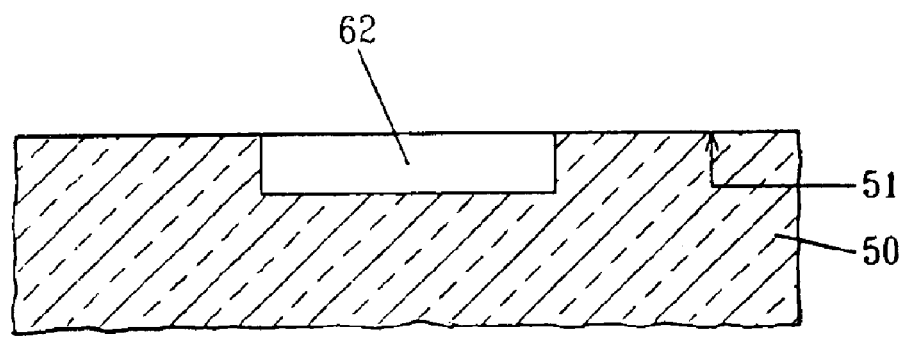

FIG. 2E shows the structure that is formed after oxide layer 52 has been removed from the structure. In this structure, the isolation region 62 has an upper surface that is substantially coplanar with the upper surface of semiconductor substrate 50. The oxide layer 52 may be removed in the present invention utilizing hot phosphoric acid or reactive ion etching (RIE).

The structure shown in FIG. 2E may then be subjected to any conventional CMOS (complementary metal oxide semiconductor) process flow that may include the following:

1. A conventional gate oxidation pre-clean and gate dielectric formation;
2. Gate electrode formation and patterning;
3. Gate reoxidation;
4. Source/drain extension formation;
5. Sidewall spacer formation by deposition and etching;
6. Source/drain formation;
7. Silicide formation; and
8. Back-end-of-the-line (BEOL) process.

The processing steps 1–8 mentioned above are well known to those skilled in the art thereof a detailed description of the same is not needed herein.

Figure 3A:
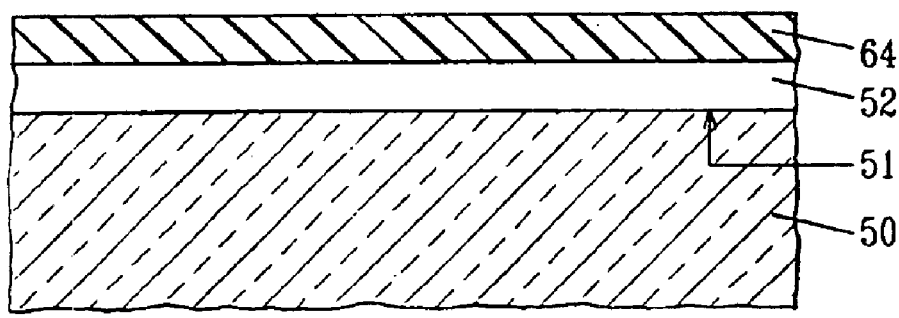
FIGS. 3A–3E are pictorial representations (through cross section views) illustrating a second method of the present invention.

Reference is now made to the second embodiment of the present invention which is illustrated in FIGS. 3A–3E. In the second embodiment of the present invention, an SOI layer and a shallow trench isolation region are formed using a thin, patterned implant mask. FIG. 3A shows an initial structure used in the second embodiment of the present invention. Specifically, the initial structure shown in FIG. 3A comprises a semiconductor substrate 50, an oxide layer 52 and an implant mask 64. The initial structure shown in FIG. 3A is similar to the one shown in FIG. 2A, except that implant mask 64 is employed in the second embodiment. The implant mask 64, which may comprise a photoresist, SiN or other material that may be removed selectively thereafter, is thin so as to permit oxygen ions to be blanket implanted into the substrate. In particular, the thickness of the implant mask 64 employed in the second embodiment of the present invention is from about 5 nm to about 500 nm. The thickness of the implant mask 64 used in the second embodiment is thin since the mask is used to form both an SOI layer and an isolation region in the substrate.

Figure 3B:
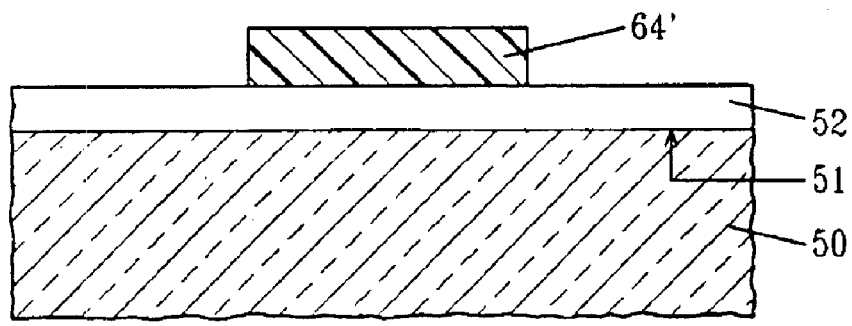

Next, the implant mask 64 is patterned by lithography providing a structure such as shown in FIG. 3B which includes patterned implant mask 64'. In some embodiments in which the implant mask 64 is other than a photoresist, the implant mask 64 is patterned by first forming a photoresist (not shown) atop the implant mask and then lithographically patterning the photoresist. The pattern in the photoresist is then transferred via a dry etching process such as RIE into the underlying implant mask 64 and then the patterned photoresist is removed from the structure via a conventional stripping process leaving behind patterned implant mask 64'.

The patterned implant mask 64' is formed in this embodiment directly over regions that will comprise the isolation region. The areas that lie to the periphery of the patterned implant mask 64' will be the active areas in which an SOI layer is formed.

Figure 3C:
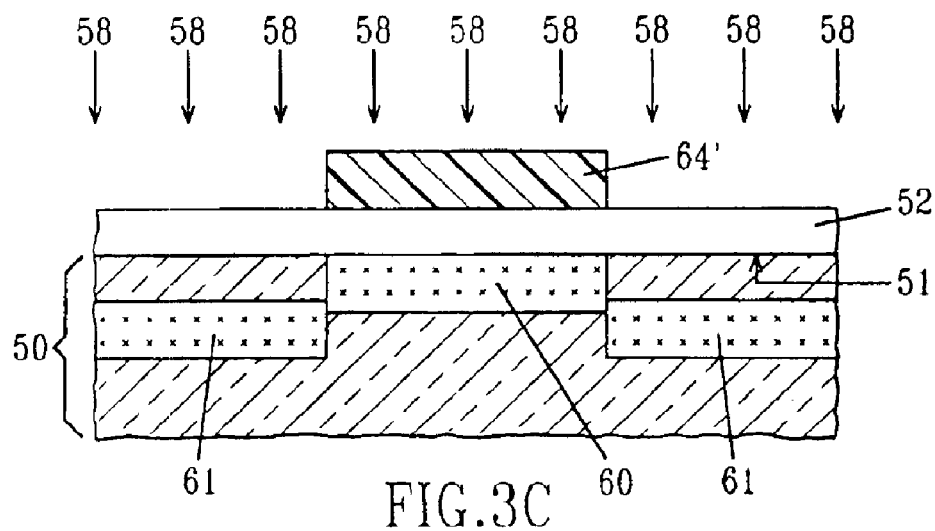
Figure 3D:
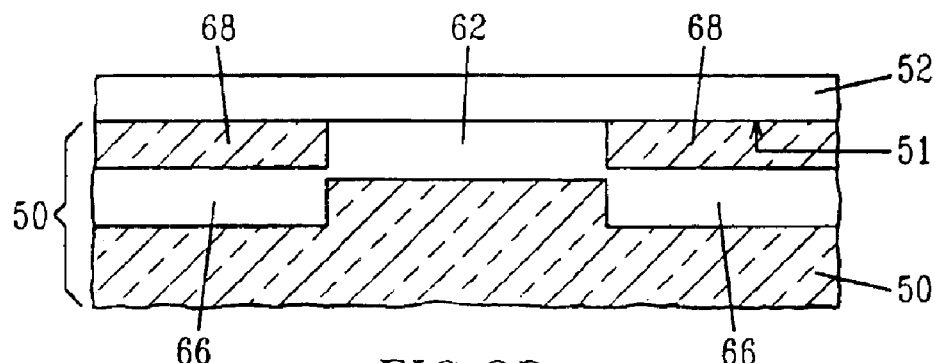

Next, and as shown in FIG. 3C, a first oxygen ion implantation process used to create an oxygen profile in the substrate is performed. Specifically, the structure including the patterned implant mask 64' is subjected to an oxygen ion implant step wherein oxygen ions 58 are implanted across the entire surface of the semiconductor substrate 50 providing a first oxygen implant region 60 and a second oxygen implant region 61. As shown, the depth of the first oxygen implant region 60 is shallower than the depth of the second oxygen implant region 61 because of the presence of the patterned implant mask 64'. In accordance with the present invention, the shallow first oxygen implant region 60 is used in forming the isolation region, while the deeper second oxygen implant region 61 is used in forming a buried oxide layer having an SOI layer located directly above the buried oxide layer.

The oxygen implant regions 60 and 61 are areas created in the substrate that have a concentration of oxygen ions that is sufficient for forming $SiO_2$ when subjected to a subsequent anneal. The upper portion of the first oxygen implant region 60 may be formed at or slightly below the interface formed between the oxide layer 52 and the upper surface 51 of the semiconductor substrate 50.

The oxygen implantation step used at this point of the present invention may comprise a conventional ion implantation process or any other technique of implanting oxygen ions may be used, for example, plasma emersion. Although the present application contemplates other techniques of implanting oxygen ions into the substrate it is preferred in the present invention to use an ion implantation step. Single or multiple ion implants may be performed.

The conditions of the oxygen implantation step used to create oxygen implant regions 60 and 61 may vary. Typically, the oxygen implant regions 60 and 61 are created using the following implantation conditions: The energy used to implant the oxygen may be in the range of from about 2 keV to about 500 keV with a current of about 100 mA. The dose of oxygen may be in the range from about $6 \times 10^{15}$ atoms/cm$^2$ to about $5 \times 10^{18}$ atoms/cm$^2$. It is noted that these implantation conditions are exemplary and that the present invention contemplates other implant conditions, i.e., energy, current, and dose, which are capable of forming an oxygen implant region in the upper surface region (i.e., at or near the substrate/oxide interface) of the semiconductor substrate 50.

In some embodiments, a second ion implant process may be performed using a lower energy compared to the initial implant mentioned above. In such an embodiment, the implant energy is typically about ¼ to about ¾ of the first implant. The purpose of the second optional implant is to connect the oxygen profile directly under the implant mask to the oxygen profile outside the masked region.

After forming the oxygen implant regions 60 and 61 into the semiconductor substrate 50, patterned implant mask 64' is removed from the structure utilizing a conventional stripping process that is capable of selectively removing the patterned implant mask 64' from an oxide layer. The structure is then annealed under conditions that are capable of converting the first oxygen implant region 60 into an isolation region 62, while converting the second oxygen implant region 61 into a buried oxide 66 having an SOI layer 68 located directly above the buried oxide 66. The resultant structure formed after removing the patterned implant mask 64' and annealing is shown, for example, in FIG 3D.

The annealing step of the present invention is carried out using a conventional furnace annealing process. It some embodiments, not shown, it may be advantageous to cap the structure with a SiN film prior to annealing. When such an embodiment is employed, the SiN film is formed directly on top of the oxide layer 52. The SiN film typically has a thickness of from about 20 nm to about 200 nm.

Although the present invention contemplates various furnace anneal conditions, it is preferred to perform the anneal at a temperature of from about 900° C. to about 1500° C. for a time period of from about 1 hour to about 30 hours. The annealing environment employed in the present invention is an oxygen-containing ambient that may or may not be admixed with an inert gas such as He, Ar, Ne, Xe, Kr and/or $N_2$. Illustrative examples of oxygen-containing ambients include, but are not limited to: $O_2$, ozone, air, steam, NO and mixtures thereof. The concentration of oxygen present during the anneal may vary from about 0.1% to about 100%. A preferred annealing atmosphere is $O_2$ that is admixed with $N_2$.

The depth of the isolation region 62 formed at this point of the present invention is determined by the energy and dose of the oxygen implantation process. Again, the present invention may be used in forming shallow trench isolation regions (having the depth ranges recited above) or deep trench isolation regions. The desired oxygen profile may be obtained by simultaneously optimizing the ion implantation energy, dose as well as the oxide layer 52 thickness.

Figure 3E:
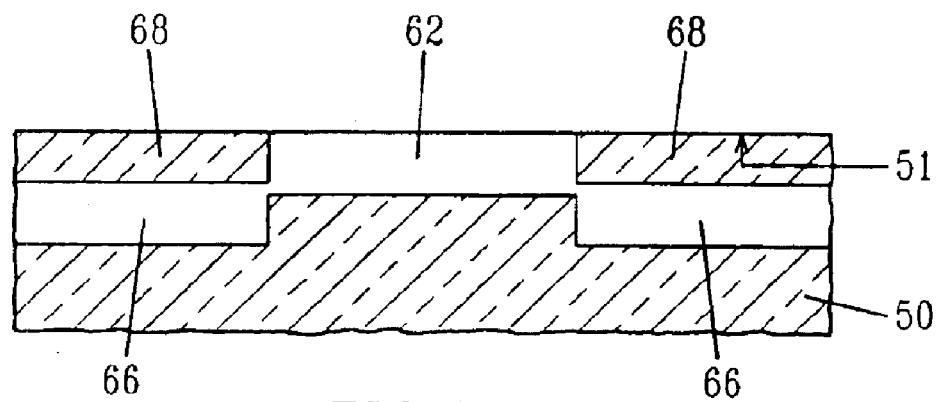

FIG. 3E shows the structure that is formed after the oxide layer 52 has been removed from the structure. In this structure, the isolation region 62 has an upper surface that is substantially coplanar with the upper surface 51 of the semiconductor substrate 50. The oxide layer 52 may be removed in the present invention utilizing hydrofluoric acid or reactive ion etching (RIE). Note that there is no interface formed between the portions of the isolation region 62 and the buried oxide layer 66 that are in contact with each other. In addition, no appreciable bird's beak, i.e., lateral encroachment of oxide, is present since the structure is formed by a SIMOX process. The bird beaks typically form at the corner between the isolation region and the semiconductor substrate.

The structure shown in FIG. 3E may then be subjected to any conventional CMOS (complementary metal oxide semiconductor) process flow that may include the following:

1. A conventional gate oxidation pre-clean and gate dielectric formation;
2. Gate electrode formation and patterning;
3. Gate reoxidation;
4. Source/drain extension formation;
5. Sidewall spacer formation by deposition and etching;
6. Source/drain formation;
7. Silicide formation; and
8. Back-end-of-the-line (BEOL) process.

The processing steps 1–8 mentioned above are well known to those skilled in the art thereof a detailed description of the same is not needed herein.

Figure 4A:
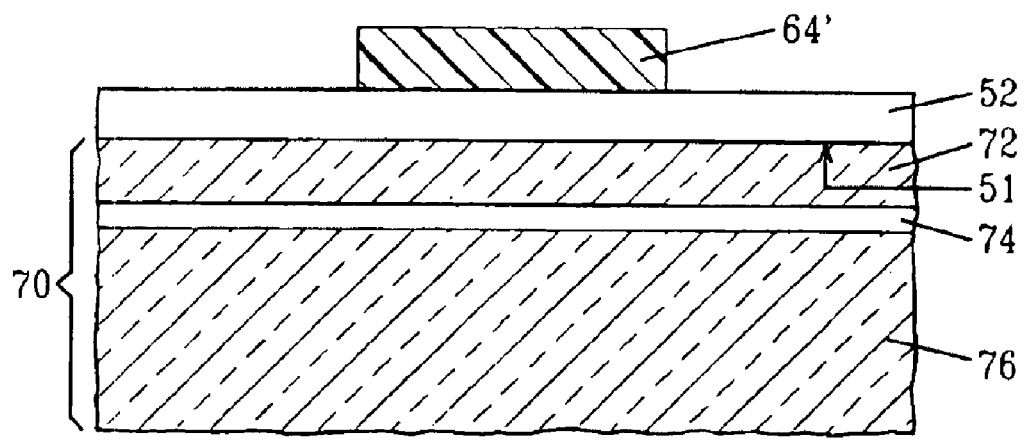
FIGS. 4A–4C are pictorial representations (through cross section views) illustrating an embodiment in which a performed SOI substrate is employed.
Figure 4B:
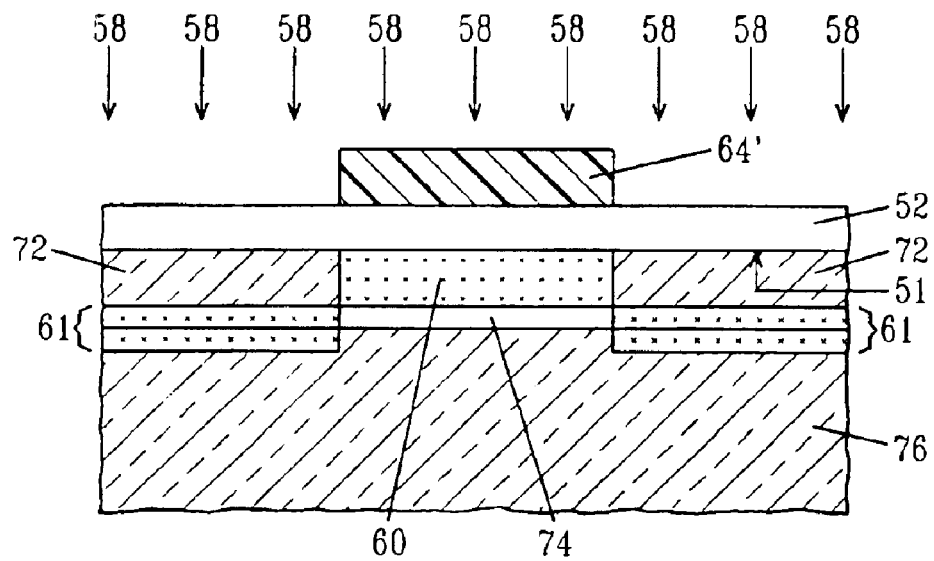
Figure 4C:
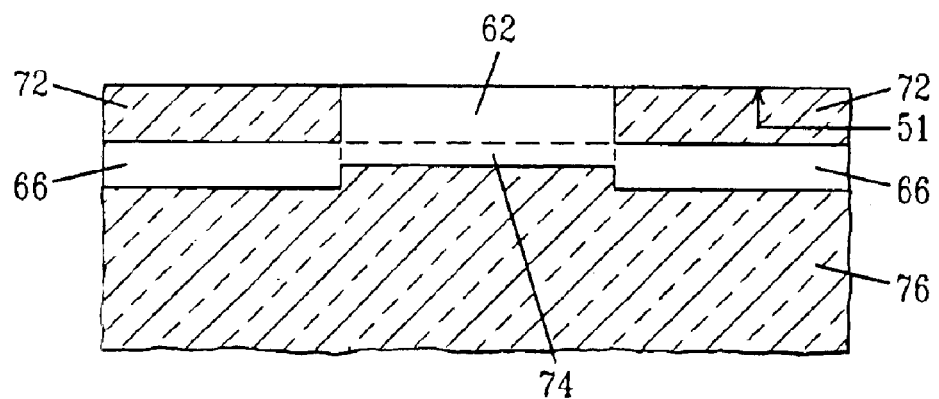

In yet another embodiment, the processing sequence of the second embodiment is performed on a performed SOI substrate. In this embodiment, the oxygen profile outside the patterned implant mask 64' is mainly contained in the buried oxide layer of the performed SOI substrate. This embodiment is advantages since it allows for additional process flexibility. FIG. 4A shows the initial structure employed in this embodiment including SOI substrate 70, oxide layer 52 and patterned implant mask 64'. The SOI substrate includes SOI layer 72, buried oxide 74 (not necessarily to scale) and bottom semiconductor 76. FIG 4B shows the implant step in which oxygen ions 58 are implanted into the SOI substrate (regions 60 is the first implant region used in forming the isolation regions, while region 61 is the second implant region used in reforming the buried oxide layer 74). FIG. 4C shows the final structure after annealing.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming an isolation region and a buried oxide in a semiconductor substrate comprising:

providing a structure having an oxide layer located on top of an upper surface of a semiconductor substrate;

selectively implanting oxygen ions into the semiconductor substrate to form a first oxygen implant region in the upper surface region and a second oxygen implant region that is buried within the semiconductor substrate, wherein the step of selectively implanting oxygen ions comprises a step of first forming a patterned implant mask atop the oxide layer and implanting oxygen ions across the entire surface of the structure using an oxygen ion implantation process;

annealing the oxygen implant regions to convert the first oxygen implant region into an isolation region having an upper surface that is substantially coplanar with the upper surface of the semiconductor substrate and to convert the second oxygen implant region into a buried oxide, said isolation region and said buried oxide are adjoining and are absent of an interface therebetween and said buried oxide has an upper surface that is below that of an upper surface of said isolation region so that a semiconductor region remains above the buried oxide, but not above the isolation region; and removing said oxide layer.

2. The method of claim 1 wherein the oxide layer is formed by a thermal oxidation process or by deposition.

3. The method of claim 1 wherein the patterned implant mask comprises a photoresist or SiN.

4. The method of claim 1 wherein the patterned implant mask has a thickness of from about 5 nm to about 500 nm.

5. The method of claim 1 wherein the step of selectively implanting oxygen ions comprises at least a first ion implantation process that is performed at an energy of from about 2 keV to about 500 keV, a current of about 100 mA and an oxygen dose of from about $6\times10^{15}$ atoms/cm$^2$ to about $5\times10^{18}$ atoms/cm$^2$.

6. The method of claim 5 wherein the step of selectively implanting oxygen ions includes a second ion implantation process that is carried out at a lower energy than the first ion implantation process.

7. The method of claim 1 wherein the annealing is performed in an oxygen-containing ambient at a temperature of from about 900° C. to about 1500° C. for a time period of from about 1 hour to about 30 hours.

8. The method of claim 7 wherein the oxygen-containing ambient is admixed with an inert gas.

9. The method of claim 1 wherein the annealing is performed in a gas mixture of oxygen and nitrogen.

10. The method of claim 1 wherein the isolation region is a shallow trench isolation region having a depth, as measured from the top surface of the semiconductor substrate, of about 1 µm or less.

* * * * *